(12) United States Patent
Onishi et al.

(10) Patent No.: US 8,083,907 B1
(45) Date of Patent: Dec. 27, 2011

(54) HYDROGEN STORAGE NANO-FOIL AND METHOD OF MANUFACTURE

(75) Inventors: Shinzo Onishi, Palm Harbor, FL (US); Melynda Calves, Riverview, FL (US)

(73) Assignee: University of South Florida, Tampa, FL (US)

( * ) Notice: Subject to any disclaimer, the term of this patent is extended or adjusted under 35 U.S.C. 154(b) by 1793 days.

(21) Appl. No.: 10/711,552

(22) Filed: Sep. 24, 2004

Related U.S. Application Data

(60) Provisional application No. 60/481,423, filed on Sep. 26, 2003.

(51) Int. Cl.
*C23C 14/00* (2006.01)
*C23C 14/32* (2006.01)
*H01M 8/00* (2006.01)

(52) U.S. Cl. ............... 204/192.15; 204/192.14; 429/400

(58) Field of Classification Search .......... 75/255; 118/718; 205/76; 427/115, 124; 429/30, 429/41, 400; 505/300; 204/192.14, 192.15
See application file for complete search history.

(56) References Cited

U.S. PATENT DOCUMENTS

| | | | |
|---|---|---|---|
| 4,055,686 A * | 10/1977 | Steinberg et al. | 427/124 |
| 4,600,525 A | 7/1986 | Baker et al. | |
| 4,851,095 A | 7/1989 | Scobey et al. | |
| 5,156,720 A * | 10/1992 | Rosenfeld et al. | 205/76 |
| 5,759,712 A * | 6/1998 | Hockaday | 429/30 |
| 6,159,300 A * | 12/2000 | Hori et al. | 118/718 |
| 6,171,721 B1 * | 1/2001 | Narayanan et al. | 429/41 |
| 6,277,448 B2 | 8/2001 | Strutt et al. | |
| 6,478,844 B1 * | 11/2002 | Ovshinsky | 75/352 |
| 6,511,943 B1 * | 1/2003 | Serquis et al. | 505/300 |
| 6,579,573 B2 | 6/2003 | Strutt et al. | |
| 6,589,312 B1 * | 7/2003 | Snow et al. | 75/255 |
| 6,602,347 B1 * | 8/2003 | Shimoda et al. | 118/718 |
| 6,623,610 B1 | 9/2003 | Onishi | |
| 6,749,892 B2 * | 6/2004 | Chang | 427/115 |
| 2003/0077398 A1 | 4/2003 | Strutt et al. | |

OTHER PUBLICATIONS

Tantalum Hydride (www.webelements.com) [Accessed on Feb. 26, 2009].*
Zirconium Hydride (www.webelements.com) [Accessed on Feb. 26, 2009].*
Titanium Hydride (www.webelements.com) [Accessed on Feb. 26, 2009].*
Onishi, S. et al., Transparent and highly oriented ZnO films grown at low temperature by sputtering with a modified sputter gun, Applied Physics Letters, 1981, 419-421, V. 17.
Ohnishi, S. et al., Chemical Vapor Deposition of Single-Crystalline ZnO Film with Smooth Surface, Japanese Journal of Applied Physics, 1978, 773-778, 17(5).

* cited by examiner

*Primary Examiner* — Alexa Neckel
*Assistant Examiner* — Michael Band
(74) *Attorney, Agent, or Firm* — Molly L. Sauter; Smith & Hopen, P.A.

(57) ABSTRACT

A hydrogen storage system using a coiled nano-foil hydride and methods for forming the hydrogen absorbing nano-foil coil without backing materials. Intercalation of hydrogen in metal hydrides allows for large amounts of hydrogen to be stored at atmospheric temperatures and pressures. Nano-films provide a large surface area for storage of hydrogen. Excessive heating of the system is avoided by use of a modified magnetron source, and the deposition rate is increased by employing stronger magnetic fields. The foil formed is capable of storage and of mechanical self-support without breakage and expansion up to 20% of its initial volume.

33 Claims, 5 Drawing Sheets

HYDROGEN STORAGE NANO-FOIL AND METHOD OF MANUFACTURE

CROSS REFERENCE TO RELATED APPLICATION

This application claims priority to U.S. Provisional Patent Application No. 60/481,423 by the same inventors, entitled: "Hydrogen Absorbing Nano-Foil," filed Sep. 26, 2003.

BACKGROUND OF THE INVENTION

Hydrogen has the highest energy density by mass of all common fuels but has one of the lowest energy densities by volume. Hydrogen storage technology, or the ability to safely carry enough hydrogen on-board a vehicle to enable at least a 300-mile range, is critical to the success of hydrogen fuel cell technology. At the present time, there does not exist a hydrogen storage solution in the art that meets the challenging performance requirements to make hydrogen-powered automobiles competitive with conventional vehicles.

In the past, several methods have been explored for the effective storage of hydrogen. Methods known in the art include pressurized storage of gaseous hydrogen, cryogenic storage of liquid hydrogen, storage of hydrogen by intercalation in chemical and metal hydrides, and the physisorption of hydrogen onto materials.

The mechanisms of sorption, the presence of atomic or ionic hydrogen in a crystal lattice or onto amorphous materials, as well as how defects and nano-scale effects can improve storage capacity are being actively pursued in the art of hydrogen storage technology.

Low cost and efficient storage of hydrogen are the primary requirements for successful hydrogen fuel cell technology. Temperature and pressure extremes, low volumetric density, and high diffusion rates resulting from heat leaks present obstacles in storing hydrogen cryogenically at high pressures. Fabricating tanks that are non-reactive and that can safely sustain extreme pressures and temperatures has proven to be a difficult challenge.

Other methods such as physisorption and intercalation of hydrogen are very cost effective and offer much smaller storage vessels in comparison with bulk hydrogen storage solutions.

Physisorption of hydrogen onto materials with large surface areas, mainly activated carbon and carbon nano-tubes and nano-structures, has been met with significant challenges such as low volumetric and gravimetric density and very low sorption temperatures.

Metal hydrides are chemical compounds formed when hydrogen gas reacts with metals. Metal hydrides store hydrogen interstitially, incorporating the hydrogen molecules into their crystal lattice. Intercalation of hydrogen in metal hydrides has proven to be a promising method for hydrogen storage. Hydrogen intercalation allows for large amounts of hydrogen to be stored at atmospheric temperatures and pressures. Previous advances in metal hydride storage have been limited to the larger, heavier elements of the lanthanide series and to the transition elements. Lightweight metal hydrides have become the current focus of interest and are viable options requiring further study to reach full potential. The most useful metal hydrides for hydrogen storage react near room temperature at hydrogen pressures a few times greater than the Earth's atmosphere.

Increasing the surface area of metal increases the absorption kinetics associated with hydrogen. A method known in the art for improving the surface area of metal is fabricating nano-crystalline powders that exhibit very high diffusion rates, high chemical activity, and high strength. To increase the surface area per gram of metal, different institutions have tested many unique approaches. Some of these approaches include, the use of nano-particles, sponges, micro-holes on a bulk metal, nano-films on substrates. Nano-films have significant advantages over the nano-particle solutions. Nano-films allow for a very large surface area to be achieved in a compact space. However, nano-films known in the art require the use of a supporting substrate. The substrate inherently adds weight to the film which is a disadvantage in most hydrogen storage applications.

Sputtering or physical vapor deposition (PVD) is a method of depositing that involves the removal of material from a solid cathode by bombarding it with positive ions from the discharge of a rare gas such as Argon (Ar). Sputtering is known in the art for the production of nano-films on substrates. The cathode may be made of a metal or an insulator, and, in contrast to thermal evaporation, complex compounds such as high temperature superconductor (HTS) materials can be sputtered with a lower degree of chemical compositional change. Sputtering is often done in the presence of a reactive gas, such as oxygen or nitrogen, to control or modify the properties of the deposited film. There are many advantages to metal deposition by sputtering techniques. These advantages include the ability to choose from of a wide range of deposition rates for best growth conditions, the ability to control a wide range of oxygen or nitrogen levels in the resultant dielectric films, the use of oxide or non-oxide targets (such as reactive sputtering deposition), the ability to grow C-axis oriented layers on amorphous substrates, and the ability to grow not only C-axis oriented, but also A-axis oriented layers on a single-crystalline substrate Sputtering deposition systems provides high-density nucleation, which has not only C-axis but also A-axis orientation on single-crystalline substrates. This process is ideal for the first nucleation step. However the sputtering deposition method fails to make single crystal formation because of the difficulty in maintaining the correct stoichiometry at higher temperatures necessary to grow a single crystal. This is discussed in Onishi et al, "Chemical Vapor Deposition of Single-Crystalline ZnO Film with Smooth Surface on Intermediately Sputtered ZnO Thin Film on Sapphire"; Japanese Journal of Applied Physics, 1978, Vol 17, pp. 773-778, incorporated herein by reference. In order to deposit compound materials, alloy or mosaic targets are necessary. Two line sputtering sources can also be used for two-composition depositions. Multi-combination sputtering guns can be used to cancel or to trap electrons from the plasma so that the surface of the belt can be maintained at less than 90° C. This feature is described in Onishi et al, "Transparent and Highly Oriented ZnO Films Grown at Low Temperature by Sputtering with a Modified Sputter Gun"; Applied Physics Letters, 1981, Vol. 38, pp. 419-421, incorporated herein by reference.

Accordingly, what is needed in the art is a hydrogen storage nano-foil hydride that exhibits improved sorption and desorption qualities at desirable temperatures which is also light weight and easily adaptable for use as a hydrogen storage solution.

However, in view of the prior art considered as a whole at the time the present invention was made, it was not obvious to those of ordinary skill in the pertinent art how the identified need could be fulfilled.

SUMMARY OF THE INVENTION

The present invention relates to the use of hydrogen in fuel cells and the storage of hydrogen for use in fuel cells. More specifically, the instant invention relates to a novel hydrogen storage system that employs a coiled nano-foil hydride and methods for forming self-supporting hydrogen absorbing nano-foil coils.

Nano-films have shown significant advantages over the other nano-particle solutions. Additionally, in accordance with the present invention, a very large surface area can be achieved in a compact space by coiling the nano-foil, where several square meters can be spooled to the size of a 0.5 liter bottle. Taking into account at most a 20% increase in volume with hydrogen absorption, and stacking the spools for adequate fuel, a container comparable to the size of a traditional automobile's hydrocarbon fuel tank can be achieved. Low desorption temperatures can be achieved with nano-foils by incorporating voids or catalytic "impurities" into the crystal matrix, causing the hydrogen to desorb at lower temperatures and faster rates. Desorption temperatures can also be lowered by producing a gradient alloy film. Generating a gradient alloy with a material such as palladium can serve a two-fold purpose, first as a catalyst for absorption/desorption, and second as a non-reactive filter, such as a nano-layer of Pd over the surface of the nano-foil, for controlling contamination.

The method in accordance with the present invention for producing a self-supporting nano-foil effective for use in the storage of hydrogen, includes the steps of, providing a vacuum chamber, providing a conveyor belt substrate having a top surface positioned within the vacuum chamber, depositing a layer of nano polycrystalline material onto the top surface of the substrate, thereby forming a nano-foil on the top surface of the substrate and separating the nano-foil from the substrate to form a self-supported nano-foil.

In a particular embodiment, the nano polycrystalline material is platinum.

In a particular embodiment, the layer of nano polycrystalline material is deposited using magnetron sputtering. Additionally, to reduce the amount of heat that the belt substrate is subjected to during the sputtering process, a sputtering system employing two magnetron sputtering devices. In this embodiment, a first magnetron sputtering device is operated having a positive magnetic polarity and a second magnetron sputtering device is operated having a negative magnetic polarity. With this configuration, the electron flux resulting from the deposition step is trapped between the magnetron of positive polarity and the magnetron of negative polarity thereby reducing the temperature incident upon the substrate.

To increase the energy available to deposit a nano-crystalline film of good quality, additional treatments may be applied to the nano-foil. These treatments include, but are not limited to, laser annealing utilizing a laser and heating the nano-foil with a line heater after the nano-foil is separated from the substrate.

In a particular embodiment, the nano-foil is spooled into a coil following separation from the substrate. During the spooling process, the separation between successive annular rings of the coil is controlled. The foil may be coiled upon a physical spool, or coiled upon itself, independent of a physical spool.

To provide adequate support for the self-supporting nano-foil, it is within the scope of the invention to modulate the thickness of the deposited nano-foil on the substrate. The modulation may be accomplished by variation in the speed of a take-up belt that controls the duration of time a particular portion of the belt substrate is subjected to sputtering deposition. In a particular embodiment, the ends of a coiled nano-foil may be made thicker to assist in the support of the coil, the thick end of the support coil being positioned into a slot of the spool assembly.

To prevent fouling, in an additional embodiment the coiled nano-foil is moved to a storage canister residing within the vacuum chamber to prevent fouling. The storage canister is then removed from the vacuum chamber. Alternatively, the vacuum chamber may be evacuated and then filled with hydrogen gas to enable the hydride conversion of the nano-foil coil prior to removal from the vacuum chamber.

Various methods may be employed to separate the nano-foil from the belt substrate. In a particular embodiment, a roller is positioned biased to the belt. The pressure and action of the roller being sufficient to separate the nano-foil material from the belt substrate. In an alternate embodiment, a smooth wedge may be positioned biased to the belt and sandwiched between two pinch rollers, to remove the nano-foil from the substrate.

In accordance with the present invention, the method as described is effective in providing a nano-foil coil for hydrogen storage.

A system in accordance with the present invention for producing a self-supporting nano-foil for hydrogen storage includes, a vacuum chamber, a conveyor belt substrate positioned within the vacuum chamber, a belt drive assembly to drive the conveyor belt substrate, a deposition system having a target material, the deposition system located within the vacuum chamber and positioned to deposit the target material onto the belt substrate and a delaminating system located within the vacuum chamber, the delaminating system to separate the deposited target material from the belt substrate.

The conveyor belt substrate may be fabricated from a fluorocarbon resin or may alternatively have a coating of fluorocarbon resin or other material effective for use as a substrate for a deposition system as know in the art. The belt may be textured to allow for the fabrication of a textured nano-foil.

In a preferred embodiment, the deposition system is a magnetron sputtering system and the magnetron sputtering system further includes two magnetron sputtering devices, a first magnetron sputtering device having a positive magnetic polarity and a second magnetron device having a negative magnetic polarity. The two magnetron system is employed to trap the electron flux that is generated by the sputtering system between the magnetron of positive polarity and the magnetron of negative polarity, thereby reducing the electron bombardment of the substrate, which results in poor crystal orientation and excessive heat buildup.

To increase the quality of the nano-film, a laser annealer may be positioned to anneal the nano-foil after separation from the substrate. Alternatively, a line heater may be positioned to heat the nano-foil after separation from the substrate.

In an additional embodiment, the system includes a spooler positioned to spool the nano-foil into a coil after the nano-foil is separated from the substrate and a thickness modulation mechanism positioned to modify the thickness of the nano-foil deposited on the substrate by the deposition system. The modulation mechanism is effective in controlling the speed of the belt drive assembly to modulate the thickness of the nano-foil deposited on the substrate.

In a particular embodiment, the belt drive assembly to drive the conveyor belt substrate includes a driving roller having a shaft, a driving gear coupled to the shaft and a stepper motor coupled to the driving gear to control the speed of the belt drive assembly. However, additional configurations of the belt drive assembly are within the scope of the present invention.

To delaminate the nano-foil from the substrate, a delaminating roller biased to the conveyor belt substrate is provided. The contact between the delaminating roller and the conveyor belt substrate is sufficient to effectively separate the deposited nano-foil from the substrate. In a particular embodiment, a spool assay is provided. The spool assay includes a spool comprising a plurality of spool slots to receive the nano-foil after separation from the substrate and a tension assembly including a spool array positioned on an upward slope relative to the delaminating roller, the tension assembly providing pressure to the conveyor belt substrate. Alternatively, the delaminating may transpire through the use of a wedge shaped bar biased to the conveyor belt substrate, two pinch rollers positioned to sandwich the wedge shaped bar and the conveyor belt substrate between them and a spool assay, the spool assay having a spool including a plurality of spool slots to receive the nano-foil after separation from the substrate by the wedge shaped bar and pinch rollers. Other means effective for the separation of the nano-foil from the substrate are within the scope of the invention.

After the nano-foil has been separated from the substrate and coiled, the coil may be removed from the spooler and placed into a storage canister. The storage canister is positioned within the vacuum chamber to prevent fouling of the nano-foil.

Accordingly, the present invention provides a system and method for the production of a self-supporting nano-film to be used for hydrogen storage. The self-supporting nano-film in accordance with the present invention is a compact film of hydride composition exhibiting improved sorption and desorption qualities at desirable temperatures which is also light weight and easily adaptable for use as a hydrogen storage solution.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
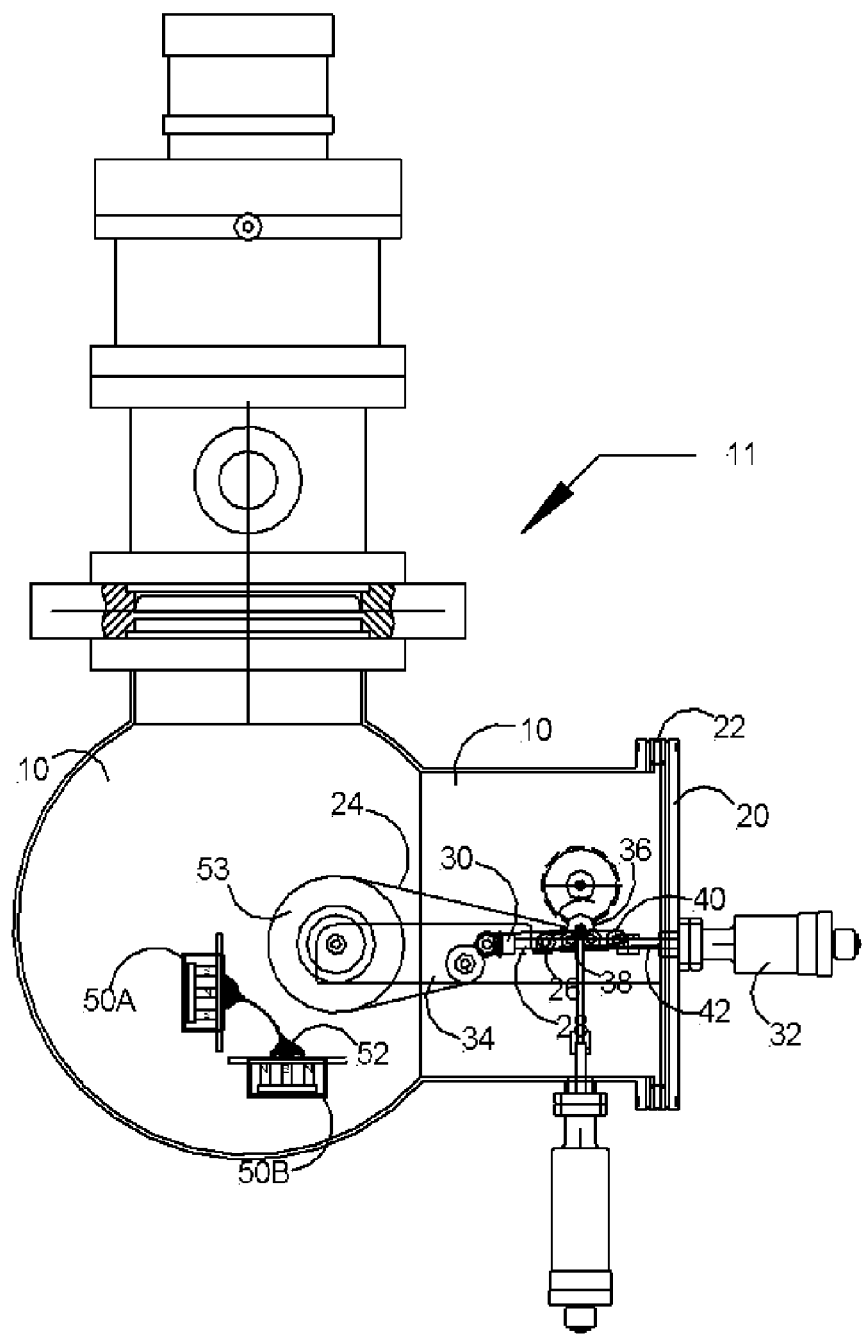
FIG. 1 is a diagrammatic view of the sputtering deposition system and spooling mechanism in accordance with the present invention.

The nano-foil of the instant invention is deposited on a thin, temporary substrate, and then removed from that temporary substrate with a sharp bend. This bend is achieved by the movement of the belt through a small radius or roller for effectively delaminating the nano-foil from the belt. A moving belt with temporary or permanent pinch rollers may be used for enhancement of the delamination from the belt. It is also contemplated that any other roller or winding equipment that is known to those of ordinary skill in the art may also be utilized in the instant apparatus to delaminate the nano-foil from the temporary substrate.

If desired the surface of the nano-foil may also be textured. Texturing of the nano-foil may be achieved by texturing the belt upon which the nano-foil is deposited. Texturizing the nano-foil will permit better hydrogen gas penetration inside the spooled nano-foil. In addition, two different textured nano-foils may be spooled on a coil to enhance further hydrogen penetrations. When nano-foils have absorbed the hydrogen gas, forming the hydride, the volume of the nano-foil increases by a factor of up to 20%. Thus, in a particular embodiment, a textured nano-foil is capable of withstanding hydrogen treatment without breaking.

In a magnetron sputtering system, the nano-foil material sources comprise the targets. It is within the scope of the present invention to substitute the magnetron sputtering system with an electron beam, ion beam, or laser deposition systems commonly known in the art. They can be made by laser ablation from a carbon target, by chemical vapour deposition (CVD) or by passing a precursor gas such as acetylene through a plasma discharge In some instances, the nano-foil may be too thin to support itself. To alleviate this problem the thickness of the nano-foil may be modulated to give some mechanical support to the spooled foil. This is accomplished by thickening the actual foil at the beginning of the spool. In the preferred embodiment, the thickened end of the foil is inserted into a slit in the spool device and the nano-foil is coiled onto the spool continuously until the desired spool thickness is achieved. A separate drive mechanism is used to rotate the spool, along with the appropriate driving mechanisms, and the entire spooling apparatus, in the preferred embodiment, is contained within the sputtering chamber. This arrangement is representative of the preferred embodiment, and it is understood that modifications to this structure is well within the scope of ordinary skill in the art, and therefore contemplated.

After the desired amount of material is spooled onto the spooling device, the spooled foil is then transferred into a canister for storage and further processing. This canister is preferably sealed and removed from the sputtering chamber for charging with the hydrogen and discharge testing. This is accomplished, in the preferred embodiment, without exposure to the ambient air to prevent any fouling of the system. The final spool product may contain a support spool or may also be a free-standing coil of foil itself.

To increase the deposition rate, a PVD system employing strong magnetic fields is preferred. A system as disclosed in Onishi, U.S. Pat. No. 6,623,610 provides an improved erosion profile, the disclosure of which is incorporated herein by reference. To further enhance deposition rate, the magnetron system may be operated without sputtering gas after stabilizing the operation of the system.

PVD layers are micro or nano polycrystalline structures. To enhance hydrogen sorption capacity, all kinds of defects can be used, including, but not limited to, grain boundaries, distortions, impurities and alloys. Since at low temperatures, there may not be enough energy present to deposit a nanocrystalline film of good quality, laser annealing, passing of the film through two line heaters or other post-sputtering treatments as known to those of ordinary skill in the art may be added to the processing of the foil before the spooling operation.

Since the nano-foil may not support itself, in addition to the thickening of the primary supporting end, the speed of the take-up belt may be varied to modulate the thickness of the foil. The additional apparatus necessary to vary the spooling rate is considered within the scope of ordinary skill in the art.

Although vacuum-to-vacuum transfer is the preferred embodiment, it is also considered within the scope of the instant invention that the sputtering chamber may be evacuated and subsequently filled with the hydrogen gas and the conversion to hydride takes place prior to transfer of the foil from the chamber into the canister. Modifications of this procedure are also deemed to be variations available to those of ordinary skill in the art.

Figure 2:
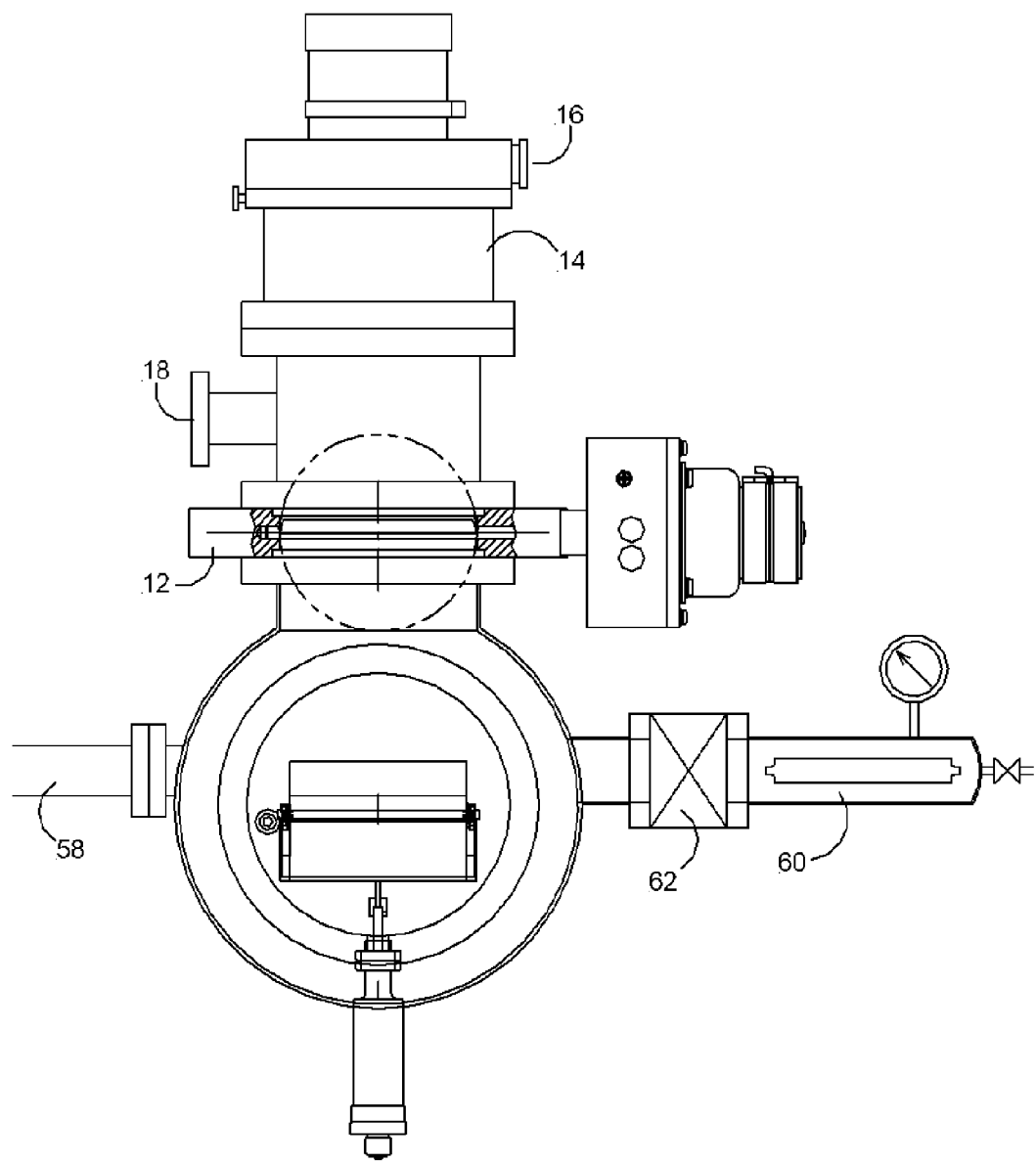
FIG. 2 is a diagrammatic view of the sputtering deposition system and spooling mechanism in accordance with the present invention.
Figure 3:
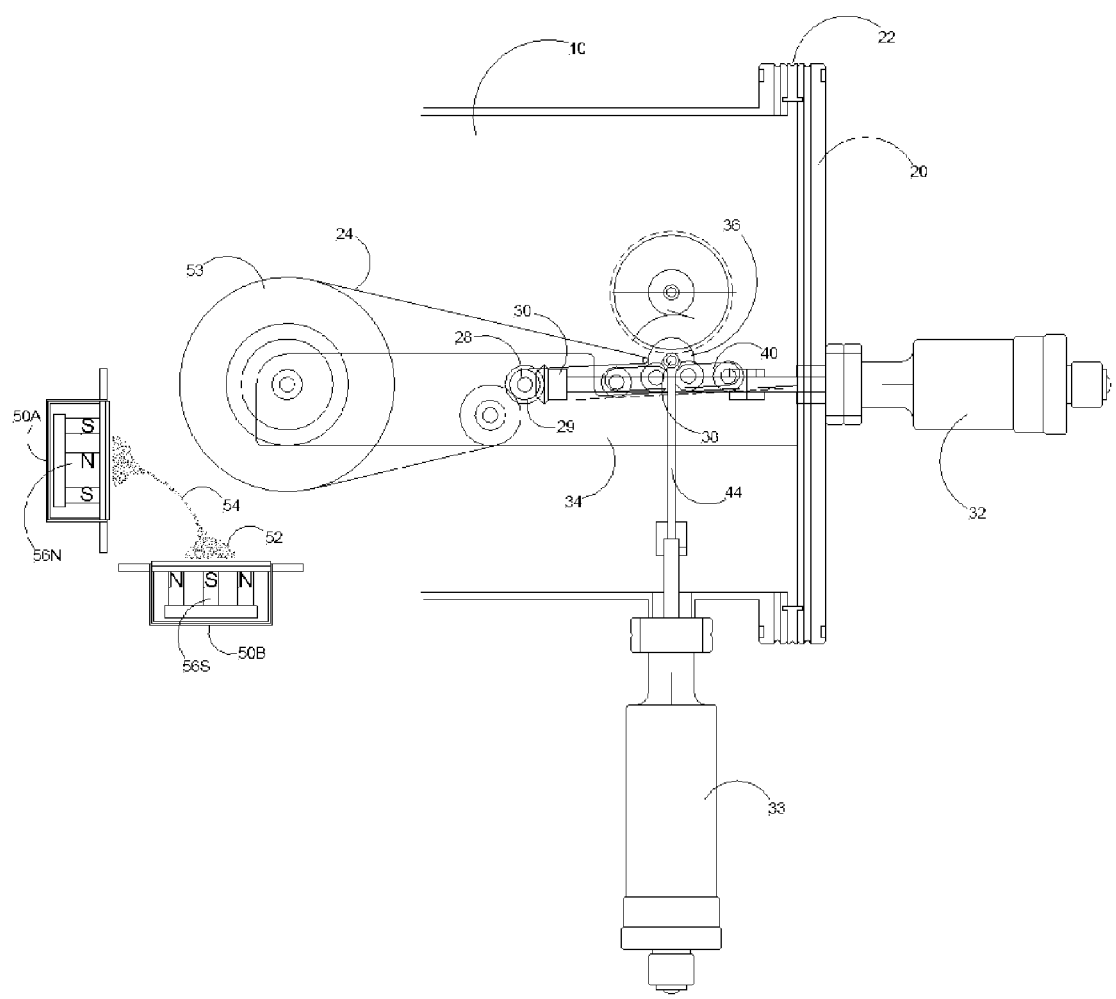
FIG. 3 is a diagrammatic view of the nano-foil deposition in the sputtering chamber and the spooling mechanism in accordance with the present invention.

FIG. 1, FIG. 2 and FIG. 3 illustrate a sputtering system 11 in accordance with the present invention. The sputtering process occurs in vacuum chamber 10, containing two line PVD sources, denoted as 50A and 50B of the material desired to be sputtered onto the moving belt substrate 24, which is adapted to receive the nano-foil as a coating of the material deposited from the target using RF or pulsed DC power. The belt 24 is driven by roller 29 and shaft 28, which are in turn coupled by driving gear 30 to the stepper motor 32 as shown in FIG. 2.

Figure 4:
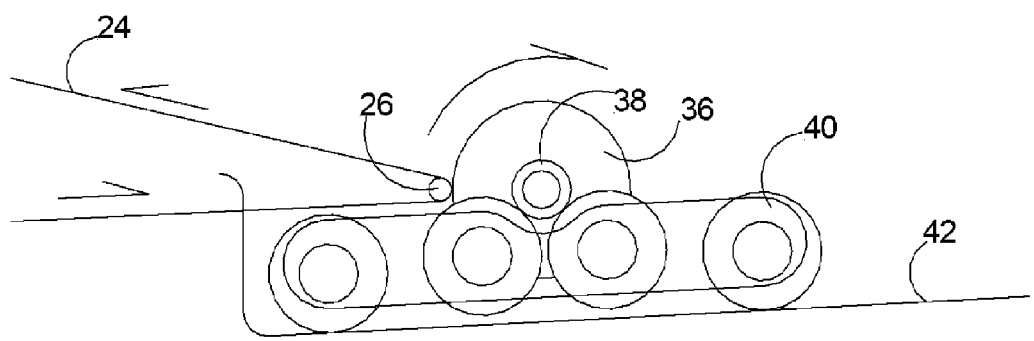
FIG. 4 is a diagrammatic view of one type of continuous foil spooling in accordance with the present invention.
Figure 5:
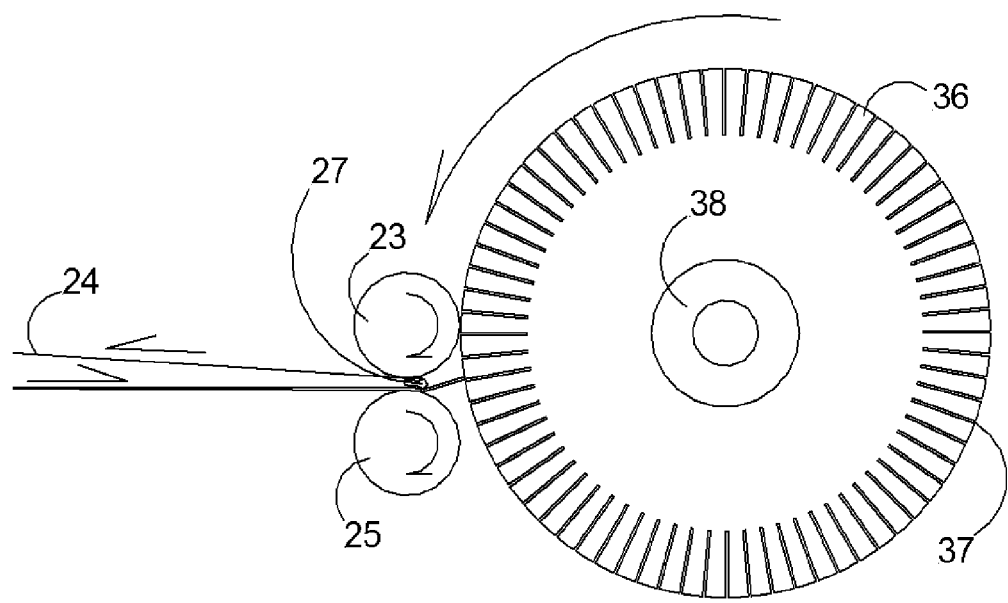
FIG. 5 is a diagrammatic view of a variation in spooling also in accordance with the present invention.

FIG. 4 and FIG. 5 illustrate the spool apparatus in greater detail. The deposited nano-foil is separated from the belt 24 at the side of a small roller 26. The nano-foil separated from the belt is spooled on nano-foil spool 36 using spool slots 37 combined with an initial thickness control as depicted by FIG. 4. The spool is biased to the belt 24 by means of a roller 26 and tensioned by a small amount of gravitational force generated by spool array 40, located on a slope designated by line 42.

FIG. 5 illustrates an additional embodiment of the invention demonstrating an enhanced nano-foil detaching method. In accordance with this embodiment, the wedge-shaped, but smooth bar 27 supports the end of the belt proximal to the spool 36. Two pinch rollers 23 and 25 compress the belt 24 so that the bending radius of the belt 24 is reduced. This gives an enhanced separation of the foil from the belt as compared to the apparatus illustrated by FIG. 3.

As shown with reference to FIG. 2 and FIG. 4, the spool drive shaft 28 impels the belt 24 via driving roller 29 and drive gear 30. Since the spool assembly 40 at the distal end of belt 24 presses toward the moving belt 24, the force generated by the weight of positioning along slope 42 affects the uptake of the spool, which is caused by the resulting frictional effects on the moving belt 24. For this reason, the system requires a minimal amount of tensioning, allowing for long and continuous spooling of the self-supported foil. The entire spooling apparatus can also be repositioned by spool lifter 44 and also engaged with a manipulating means before transferring the foil to a storage canister.

Nano-foils on the belt are especially sensitive to electron bombardment, which results in poor crystal orientation and also in excessive heat buildup on the substrate. In depositing the nano-foil onto the belt substrate 24, the electron leak from the high-density plasma bombardment of the target forms an electron beam 54, which subsequently hits the substrate belt 24. If two magnetrons are arranged side by side, then the electron beams that are generated repel each other and two separate electron beams affect the substrate as in the case of a conventional sputtering apparatus. As such, with a conventional planar magnetron sputtering systems, most of the electrons are trapped in the magnetic field.

By contrast, in the instant apparatus, an improved arrangement is formed by reversing the polarity of the magnetrons 56N and 56S, allowing the electron beam 54 to travel from one magnetron to the other continuously. This takes into account the sensitivity of the belt 24 with respect to temperature and electron bombardment by trapping the electron beam leakage 54 from the plasma 52 on the target. Since the substrate holder is at positive potential, the substrate is still bombarded by some electrons. The electron flow affects the magnetic flux so that two magnetrons, each opposite in magnetic polarity, trap electron flux effectively. The electron flux moves back and forth between two opposite magnetic polarities as shown in FIG. 2. Thus the moving belt or substrate receives no major electron bombardment on it and the Teflon, or temperature sensitive belt, can be protected from heat damage at high power PVD operations.

In addition to a nano-foil coil or spool the instant apparatus may be modified to produce any desired geometric shape of foils, including linear sheets of finite length. In this case the sputtering may be altered to form gaps or a suitable cutting member may be situated in the post-sputtering apparatus. This type of modification, and any others for other geometries, are considered within the scope of ordinary skill in the art.

What is claimed is:

1. A method of producing a self-supported hydrogen absorbing nano-foil for hydrogen storage, the method comprising the steps of:
   providing a vacuum chamber;
   providing a conveyor belt substrate having a top surface positioned within the vacuum chamber;
   depositing a layer of hydrogen absorbing nano polycrystalline material directly onto the top surface of the conveyor belt substrate, thereby forming a hydrogen absorbing nano-foil on the top surface of the conveyor belt substrate; and
   separating the hydrogen absorbing nano-foil from the substrate to form a self-supported hydrogen absorbing nano-foil, by moving the conveyor belt substrate through a small radius bend in the conveyor belt substrate.

2. The method of claim 1, wherein the layer of hydrogen absorbing nano polycrystalline material is deposited using magnetron sputtering.

3. The method of claim 2, further comprising the steps of:
   providing a magnetron sputtering device having a positive magnetic polarity;
   providing a magnetron sputtering device having a negative magnetic polarity; and
   trapping the electron flux resulting from the deposition step between the magnetron of positive polarity and the magnetron of negative polarity.

4. The method of claim 1, further comprising the step of annealing the hydrogen absorbing nano-foil by laser annealing after the hydrogen absorbing nano-foil is separated from the substrate.

5. The method of claim 1, further comprising the step of heating the hydrogen absorbing nano-foil with a line heater after the hydrogen absorbing nano-foil is separated from the substrate.

6. The method of claim 1, further comprising the step of spooling the hydrogen absorbing nano-foil after the hydrogen absorbing nano-foil is separated from the substrate.

7. The method of claim 1, further comprising the step of modulating the thickness of the hydrogen absorbing nano-foil deposited on the substrate.

8. The method of claim 7, wherein the step of modulating the thickness of the hydrogen absorbing nano-foil further comprises providing a take-up belt and varying the speed of the take-up belt.

9. The method of claim 1, further comprising the steps of:
   providing a support spool; and
   coiling the hydrogen absorbing nano-foil onto the support spool after the hydrogen absorbing nano-foil has been separated from the substrate.

10. The method of claim 1, further comprising the step of coiling the hydrogen absorbing nano-foil to form a coil, having controlled separation between successive annular rings of the coil, after the hydrogen absorbing nano-foil has been separated from the substrate.

11. The method of claim 1, further comprising the steps of:
evacuating the vacuum chamber; and
filling the evacuated chamber with hydrogen gas.

12. The method of claim 1, further comprising the steps of:
providing a storage canister within the vacuum chamber;
transferring the hydrogen absorbing nano-foil to the canister for removal from the vacuum chamber without exposure to ambient air to prevent fouling.

13. The method of claim 1, wherein the small radius bend in the conveyor belt substrate is provided by a roller.

14. The method of claim 1, further comprising:
a hydrogen absorbing nano-foil coil for hydrogen storage manufactured by the process according to claim 1.

15. A system for producing a self-supporting hydrogen absorbing nano-foil for hydrogen storage, the system comprising:
a vacuum chamber;
a conveyor belt substrate positioned within the vacuum chamber;
a belt drive assembly to drive the conveyor belt substrate;
a deposition system having a hydrogen absorbing target material, the deposition system located within the vacuum chamber and positioned to deposit a layer of hydrogen absorbing target material directly onto the belt substrate to form a hydrogen absorbing nano-foil; and
a delaminating system located within the vacuum chamber, the delaminating system to separate the deposited hydrogen absorbing nano-foil from the belt substrate by moving the conveyor belt substrate through a small radius bend in the conveyor belt substrate.

16. The system of claim 15, wherein the conveyor belt substrate is fabricated of fluorocarbon resin.

17. The system of claim 15, wherein the hydrogen absorbing target material is a metal hydride.

18. The system of claim 15, wherein the conveyor belt substrate is textured.

19. The system of claim 15, wherein the deposition system is a magnetron sputtering system.

20. The system of claim 19, wherein the magnetron sputtering system further comprises two magnetron sputtering devices, a first magnetron sputtering device having a positive magnetic polarity and a second magnetron device having a negative magnetic polarity, such that the electron flux resulting generated by the sputtering system is trapped between the magnetron of positive polarity and the magnetron of negative polarity.

21. The system of claim 15, further comprising a laser annealer positioned to anneal the hydrogen absorbing nano-foil after separation from the substrate.

22. The system of claim 15, further comprising a line heater positioned to heat the hydrogen absorbing nano-foil after separation from the substrate.

23. The system of claim 15, further comprising a spooler positioned to spool the hydrogen absorbing nano-foil into a coil, the coil having controlled separation between successive annular rings of the coil, after the hydrogen absorbing nano-foil is separated from the substrate.

24. The system of claim 15, further comprising a thickness modulation mechanism positioned to modify the thickness of the hydrogen absorbing nano-foil deposited on the substrate by the deposition system.

25. The system of claim 24, whereby the modulation mechanism controls the speed of the belt drive assembly to modulate the thickness of the hydrogen absorbing nano-foil deposited on the substrate by the deposition system.

26. The system of claim 15, wherein the belt drive assembly to drive the conveyor belt substrate further comprises:
a driving roller having a shaft;
a driving gear coupled to the shaft; and
a stepper motor coupled to the driving gear to control the speed of the belt drive assembly.

27. The system of claim 15, wherein the delaminating system further comprises:
a delaminating roller biased to the conveyor belt substrate, contact between the delaminating roller and the conveyor belt substrate sufficient to effectively separate the deposited hydrogen absorbing nano-foil from the substrate; and
a spool assay, the spool assay having a spool comprising a plurality of spool slots to receive the hydrogen absorbing nano-foil after separation from the substrate; and
a tension assembly comprising a spool array positioned on an upward slope relative to the delaminating roller, the tension assembly providing pressure to the conveyor belt substrate.

28. The system of claim 15, wherein the delaminating system further comprises:
a wedge shaped bar biased to the conveyor belt substrate;
two pinch rollers positioned to sandwich the wedge shaped bar and the conveyor belt substrate between them; and
a spool assay, the spool assay having a spool comprising a plurality of spool slots to receive the hydrogen absorbing nano-foil after separation from the substrate by the wedge shaped bar and pinch rollers.

29. The system of claim 23, further comprising a spool lifter to remove the coil of hydrogen absorbing nano-foil from the spooler.

30. The system of claim 15, further comprising a canister positioned within the vacuum chamber, the canister to receive and store the hydrogen absorbing nano-foil spool upon removal from the vacuum system.

31. The system of claim 15, wherein the conveyor belt substrate is textured.

32. The system of claim 15, further comprising a defect introduction mechanism, whereby defects are introduced onto the hydrogen absorbing nano-foil to enhance hydrogen sorption.

33. The method of claim 1, wherein the hydrogen absorbing nano polycrystalline material is a metal hydride.

* * * * *